(12) United States Patent (10) Patent No.: US 7,742,887 B2
Patel et al. (45) Date of Patent: Jun. 22, 2010

(54) IDENTIFYING PROCESS AND TEMPERATURE OF SILICON CHIPS

(75) Inventors: Jagrut Viliskumar Patel, San Diego, CA (US); Martin Vyungchon Choe, San Diego, CA (US); Ziad Mansour, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 10/750,342

(22) Filed: Dec. 31, 2003

(65) Prior Publication Data

US 2005/0114056 A1 May 26, 2005

Related U.S. Application Data

(63) Continuation-in-part of application No. 10/722,350, filed on Nov. 25, 2003, now abandoned.

(60) Provisional application No. 60/525,103, filed on Nov. 24, 2003.

(51) Int. Cl.
*G01R 23/00* (2006.01)

(52) U.S. Cl. ........................................ 702/75

(58) Field of Classification Search .................. 702/75, 702/58, 81, 106, 132; 709/106, 107; 327/538, 327/141, 156, 162; 438/238
See application file for complete search history.

(56) References Cited

U.S. PATENT DOCUMENTS

| | | | | |
|---|---|---|---|---|
| 4,453,834 A | * | 6/1984 | Suzuki et al. | ............... 368/201 |
| 5,385,865 A | * | 1/1995 | Nieder et al. | ............... 438/238 |
| 5,498,977 A | | 3/1996 | Pickup | |
| 5,568,083 A | * | 10/1996 | Uchiyama et al. | ........... 327/538 |
| 5,795,068 A | * | 8/1998 | Conn, Jr. | ................... 374/170 |
| 6,025,745 A | | 2/2000 | Lee et al. | |
| 6,067,508 A | * | 5/2000 | Conn, Jr. | .................... 702/132 |
| 6,175,928 B1 | | 1/2001 | Liu et al. | |
| 6,442,704 B1 | * | 8/2002 | Morimoto et al. | .......... 713/500 |
| 6,445,238 B1 | | 9/2002 | Lesea | |
| 6,504,408 B1 | | 1/2003 | von Kaenel | |
| 6,556,157 B1 | | 4/2003 | Itani et al. | |
| 6,564,335 B1 | | 5/2003 | Freker | |
| 6,815,782 B2 | | 11/2004 | Bodas et al. | |
| 6,819,157 B2 | | 11/2004 | Cao et al. | |
| 6,850,107 B2 | | 2/2005 | Gomm | |
| 6,930,949 B2 | | 8/2005 | Schaefer | |
| 6,934,652 B2 | * | 8/2005 | Gauthier et al. | ............... 702/99 |
| 7,165,183 B2 | * | 1/2007 | Okada et al. | ................ 713/322 |
| 7,215,212 B2 | * | 5/2007 | Mahony et al. | ............... 331/66 |
| 2002/0075163 A1 | * | 6/2002 | Smith et al. | ............ 340/870.16 |
| 2002/0181543 A1 | * | 12/2002 | Yin | ............................. 374/170 |
| 2003/0204354 A1 | * | 10/2003 | Corr | .......................... 702/117 |
| 2003/0229662 A1 | * | 12/2003 | Luick | ......................... 709/106 |
| 2004/0003194 A1 | | 1/2004 | Bodas et al. | |

OTHER PUBLICATIONS

International Search Report, PCT/US2004/039689, International Search Authority—European Patent Office, Apr. 6, 2005.
International Preliminary Report on Patentability PCT/US2004/039689, IPEA/US Mar. 6, 2007.
Written Opinion PCT/US2004/039689, International Search Authority, European Patent Office, May 24, 2006.

* cited by examiner

*Primary Examiner*—Aditya Bhat
(74) *Attorney, Agent, or Firm*—Jiayu Xu (57) ABSTRACT

Systems and techniques are disclosed relating to communications. The systems and techniques include determining the temperature and process speed of chips used in communications devices. The systems and techniques include measuring the output of ring oscillators embedded in the chips, and calculating the temperature and process speed therefrom.

22 Claims, 7 Drawing Sheets

IDENTIFYING PROCESS AND TEMPERATURE OF SILICON CHIPS

This application is a Continuation-in-Part of U.S. application Ser. No. 10/722,350, entitled CALIBRATING AN INTEGRATED CIRCUIT TO AN ELECTRONIC DEVICE, filed Nov. 25, 2003, now abandoned which claims priority to U.S. Provisional Application Ser. No. 60/525,103, entitled CALIBRATING AN INTEGRATED CIRCUIT TO AN ELECTRONIC DEVICE, filed Nov. 24, 2003.

BACKGROUND

1. Field

The present disclosure relates to systems and techniques for identifying process and temperature of chips.

2. Background

The demand for wireless services has led to the development of an ever increasing number of chips, all of which must adhere to strict industry performance standards. Manufacturing of silicon chips is guided in part by standards and tolerances for nominal process speed. Within the guidelines of such standards, chips are designed to run at their rated clock speed for their entire expected lifetime, even in worst-case temperature and voltage conditions. Thus, part of the manufacturing process includes testing manufactured chips to identify their rated clock speed and ensure they are rated properly.

Chips for use in communications devices must generally be rated to operate at a specified nominal speed, within a certain allowed tolerance. However, a set of chips generated from a single wafer commonly will fall into a range of different process speed ratings.

In an attempt to use those portions of the wafer that produce different speed ratings, some manufacturers engage in a method of speed binning, in which the various chips produced from a single wafer are tested and batched according to their graded process speed. Batching chips according to their speed may be time consuming and costly.

Some manufacturers may even discard slow chips and fast chips that are outside of the nominal tolerance range. For example, SDRAM chips require an external clock from the host controller with control and data signals. Because the host clock is sensitive to process speed, temperature and voltage variations, it is possible that a given set of parameters used to generate timing in a controller may not hold true across all process speed, temperature and voltage variations. In such cases speed binning is commonly used. This involves sorting chips according to different speed settings, and even providing software customized for different speeds. Of course, such customized operations can be very costly.

There have been attempts to compensate for effects of a chip's operating temperature on its clock speed, however such methods have proven cumbersome. For example, additional components for measuring chip temperature and providing leads to communicate such temperature to compensation circuitry have been employed in the past. However, the additional components and leads consume valuable space on the silicon chip, and require additional costly manufacturing steps and parts.

Accordingly, there is a need for a methodology wherein all chips from a single wafer are enabled to operate at an industry specification nominal speed, regardless of temperature variations that occur during the wafer fabrication, and regardless of temperature variations that may occur during use. The specific methodology should provide an ability to determine operating temperature and process speed while a chip is in use, without implementing additional chip components or new manufacturing steps.

SUMMARY

In one aspect of the invention, a method for determining an operating parameter of a chip having first and second ring oscillators includes measuring a frequency of the first ring oscillator, measuring a frequency of the second ring oscillator, and calculating an operating parameter of the chip as a function of the first and second ring oscillator frequencies.

In another aspect of the invention, computer-readable media embodying a program of instructions is executable by a computer to perform a method of determining an operating parameter of a chip having first and second ring oscillators. The method includes measuring a frequency of the first ring oscillator, measuring a frequency of the second ring oscillator, and calculating an operating parameter of the chip as a function of the first and second ring oscillator frequencies.

In a further aspect of the invention, a system includes a chip and a processor configured to measure the frequencies of first and second ring oscillators on the chip. The processor is further configured to calculate an operating parameter of the chip as a function of the first and second ring oscillator frequencies.

In yet another aspect of the invention, an apparatus for measuring an operating parameter of a chip, the apparatus including means for measuring a frequency of a first ring oscillator, means for measuring a frequency of the second ring oscillator, and means for calculating an operating parameter of the chip as a function of the first and second ring oscillator frequencies.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings wherein.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other embodiments. The detailed description includes specific details for the purpose of providing a thorough understanding of the present invention. However, it will be apparent to those skilled in the art that the present invention may be practiced without these specific details. In some instances, well-known structures and devices are shown in block diagram form in order to avoid obscuring the concepts of the present invention.

Figure 1:
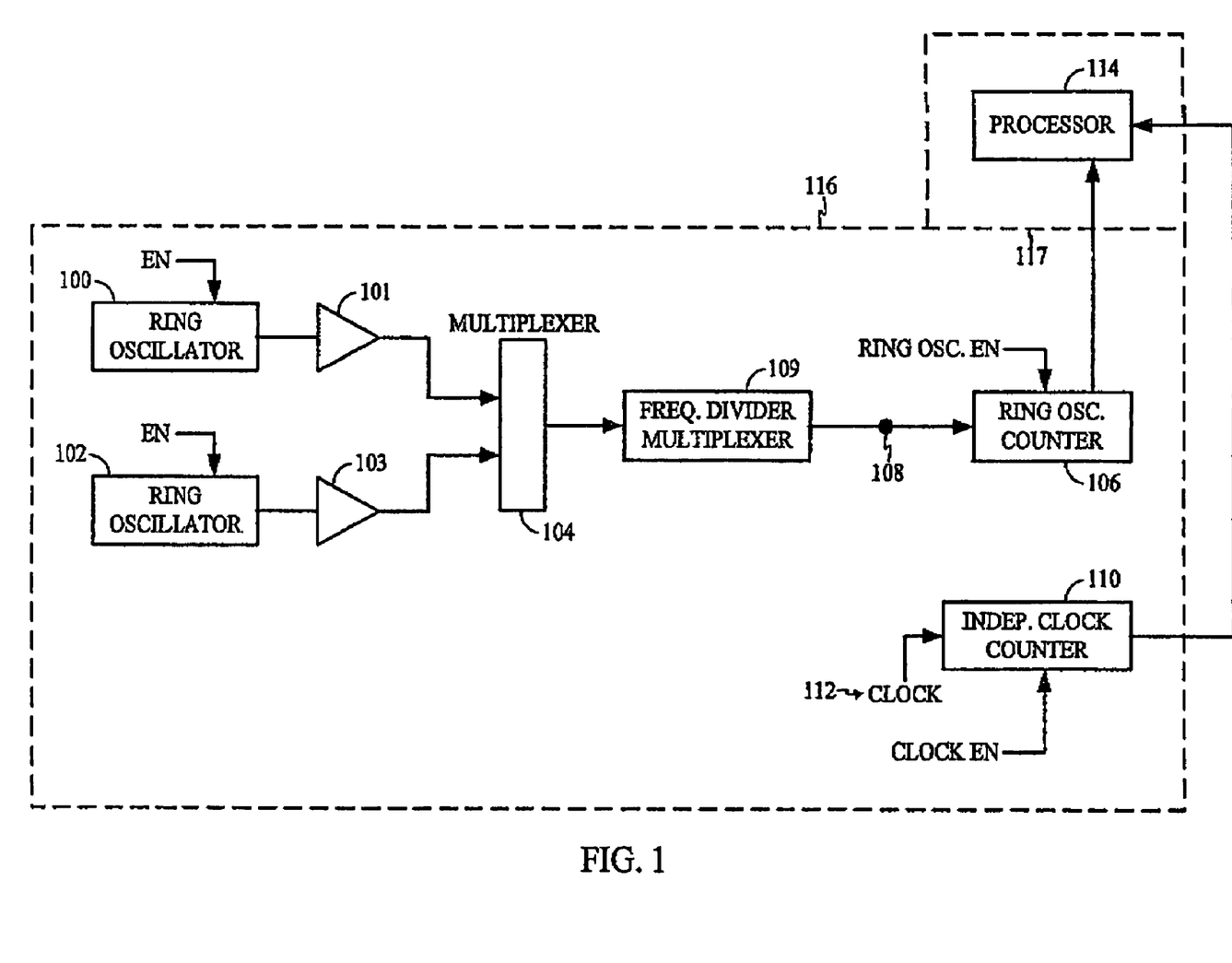
FIG. 1 is a functional block diagram of an exemplary hardware configuration comprising a dual ring oscillator configuration embedded in a chip.

FIG. 1 is a functional block diagram of an exemplary hardware configuration comprising a dual ring oscillator configuration that may be embedded on a chip 116. FIG. 1 also illustrates a processor 114 that may also be embedded on the chip 116 or, alternatively, on a separate chip (separation indicated by line 117) that receives inputs from the chip on which the dual ring oscillator configuration of FIG. 1 is embedded. Processor 114 receives inputs from the dual ring oscillator configuration, and performs various methods described herein according to the inputs. The dual ring oscillator configuration includes a first ring oscillator 100 and a second ring oscillator 102, the outputs of which are switched at multiplexer 104 after optionally conditioned by buffers 101 and 103, respectively. Chips often have a plurality of ring oscillators embedded thereon, and any two of a chip's available ring oscillators may be used as first ring oscillator 100 and second ring oscillator 102 in the dual ring oscillator configuration of FIG. 1. Each of ring oscillators 100 and 102 may comprise a plurality of inverters in serial, or may alternatively comprise some other configuration that is generally known in the art. The chip may also include a frequency divider 109 to generate a clock output 108 from the dual ring oscillator configuration. A first counter 106 may be used to count clock output 108. The chip may also include a second counter 110 that counts an independent clock output. For example, in the case of a chip that utilizes its own internal clock, second counter 110 could be configured to count the output 112 of that internal clock. The teachings herein are not limited to any specific configuration of ring oscillators 100 and 102, but instead focus on methods involving the measured frequencies of ring oscillators 100 and 102 regardless of their respective configurations. Further, processor 114 may be embedded on the same chip as the dual ring oscillator configuration, may be embedded on a separate chip, or may be part of a stand-alone device that is otherwise separate from but operably coupled to the chip having the dual ring oscillator configuration. In either case, processor 114 receives outputs from ring oscillator counter 106 and second counter 110, which comprise readable registers on the chip 116 that includes the dual ring oscillator configuration. The following figures and descriptions relate to methods performed by the processor 114.

Figure 2:
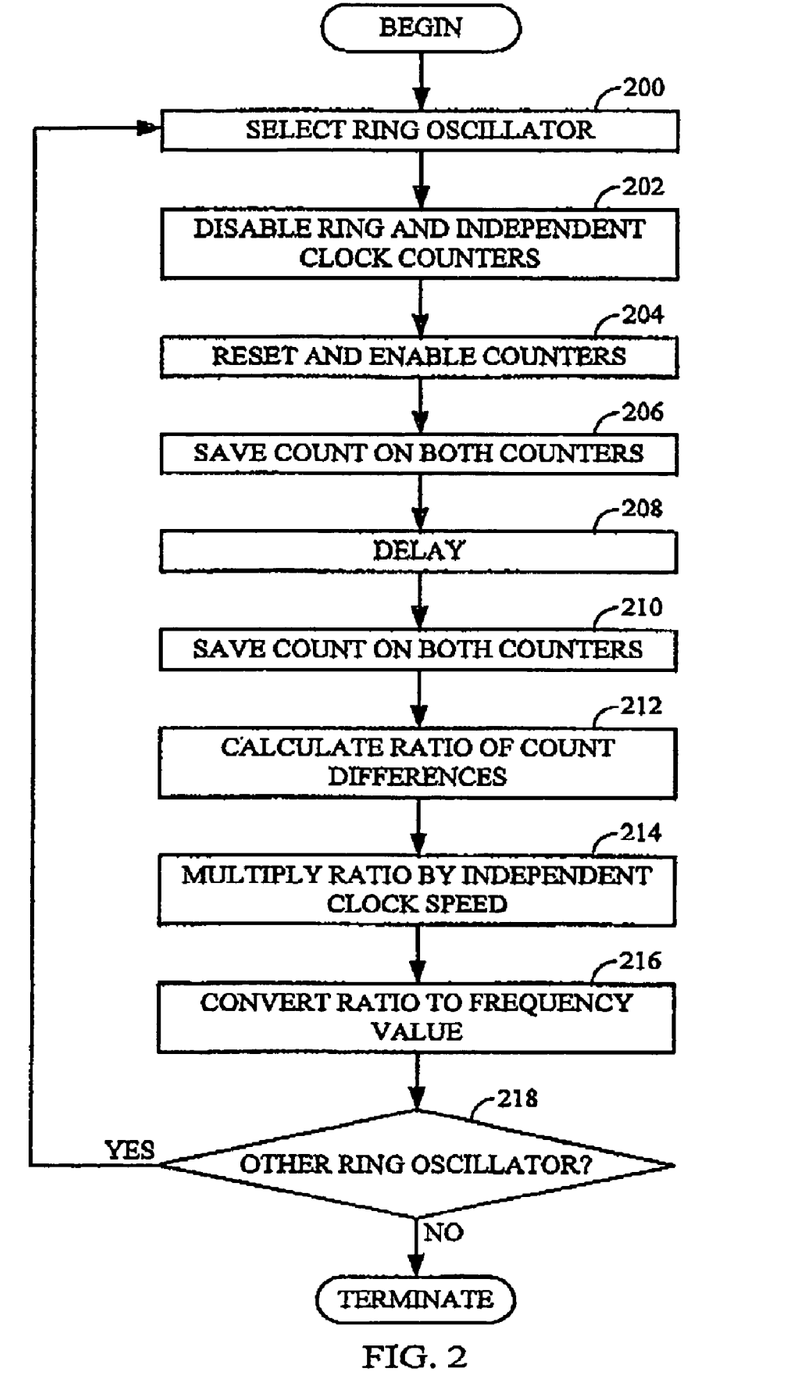
FIG. 2 is a flow chart illustrating an exemplary method for obtaining a frequency measurement from a ring oscillator embedded in a chip.

FIG. 2 is a flow chart illustrating an exemplary method for obtaining a frequency measurement from a ring oscillator embedded in a chip. At block 200, one of the two ring oscillators in the dual ring oscillator configuration of FIG. 1 is selected for obtaining a measurement of its frequency. The selected ring oscillator is enabled as the output 108 illustrated in FIG. 1. At block 202, counters for both the selected ring oscillator and an independent clock, for example the internal clock of an embedded chip, are then disabled. At block 204 the counters are simultaneously reset. Then, after a specified time delay, the counts for both of the counters are saved simultaneously at block 206. After a second delay implemented at block 208, the counts for both of the counters are again saved simultaneously at block 210. At block 212, a difference ratio of the saved count values is calculated. To calculate this ratio, the count difference of the ring oscillator between the first count save at block 206 and the second count save at block 210 is determined, and the count difference of the independent clock between the first count save at block 206 and the second count save at block 210 is determined. The ratio of these two differences is then calculated. The ratio is multiplied by the clock speed of the independent clock at block 214, to convert the ratio to a frequency value, which is output as indicated at 216. For example, a typical setting for a Tcxo counter (internal clock) of an embedded chip is 19.2 MHz, however the teachings herein are not limited to any particular clock type or speed setting. At decision block 218, it is determined whether frequency of the other ring oscillator has been measured. If not, the process repeats again at block 200, with the second ring oscillator now being selected and enabled as the output 108. In this fashion, the frequencies of both the first and second ring oscillators in the dual ring oscillator configuration are measured. These steps may be performed by a processor that is also embedded on the chip, or may be performed by a separate processor embedded on a second chip, wherein inputs to the separate processor are obtained by the ring oscillator counter and independent clock counter, which comprise readable registers on the chip whose ring oscillator frequencies are being measured.

Once the two ring oscillator frequencies have been determined, various methods disclosed herein may be implemented to calculate the operating temperature and process speed of the chip. As with determination of ring oscillator frequencies, the methods described below may be performed by a processor that is also embedded on the chip, or may be performed by a separate processor embedded on a second chip that is operably coupled to the chip whose temperature and process speed are being measured. The methods are based upon measurable relationships between a chip's ring oscillator frequency and its process speed and temperature. Specifically, because the frequency of each of a chip's ring oscillators is a function of the process speed, voltage, and temperature of a chip during operation, different sets of equations according to the particular mathematical relationships can be implemented to calculate either process speed or temperature according to known characterization data of the ring oscillators and the chip. For example, the frequency of the first ring oscillator, $f_1$, and the frequency of the second ring oscillator, $f_2$, are each functions of the change in process speed $\Delta P$, the voltage V, and the temperature T of the chip as follows:

$$f_2 = f(\Delta P2 \cdot V \cdot T)$$

and $$f_2 = f(\Delta P2 \cdot V \cdot T)$$

Therefore, the product of the first and second ring oscillators is also a product of those functions:

$$f_2 \cdot f_1 = f(\Delta P2 \cdot V \cdot T)(\Delta P1 \cdot V \cdot T)$$

It follows that the product of the first and second ring oscillators is a function of process speed, voltage, temperature and a constant K, denoting device delay:

$$f_2 \cdot f_1 = f(K \cdot \Delta P1 \cdot \Delta P2 \cdot V^2 \cdot T^2)$$

Because voltage V is constant, and $\Delta P1 \cdot \Delta P2 \gg T^2$, it follows that the product of the first and second ring oscillators is proportional to the temperature squared, without dependency on process speed:

$$f_2 \cdot f_1 \propto f(T^2)$$

Similarly, the quotient between $f_1$ and $f_2$ is proportional to the process speed. Thus, an algorithm based upon a series of equations based on the known relationships described above may be implemented to calculate process speed from ring oscillator frequency for a given temperature and voltage.

According to the known relationship of ring oscillator frequency to temperature, which is independent of process speed, exemplary techniques disclosed herein may be used to determine operating temperature of a chip as a function of ring oscillator frequency. In one embodiment, the techniques may implement a series of equations according to a linear model that may be developed through the empirical testing of a large number of chips from various "splits" that are representative of the range of process speeds achieved from an entire production lot. As used herein, the term "split" denotes a set of chips that may be either slower than nominal, faster than nominal, or nominal. A production wafer may include various splits. Because the chips produced from any given wafer will include a range of slow, fast and nominal chips, i.e. a range of different splits, the testing and collection of characterization data across the entire split range can be used to develop a linear model representative of all chips that may be produced from the production lot. Those skilled in the art will recognize various methods of collecting characterization data for this range of chips. For example, chips for gathering empirical data for a particular split may be identified either through a precise manufacturing method in which a wafer is carefully controlled during production to produce only a single type of chip (such as only slow, only nominal or only fast), or by speed binning the resultant chips from manufactured wafers that produce numerous splits.

Figures 3, 4:
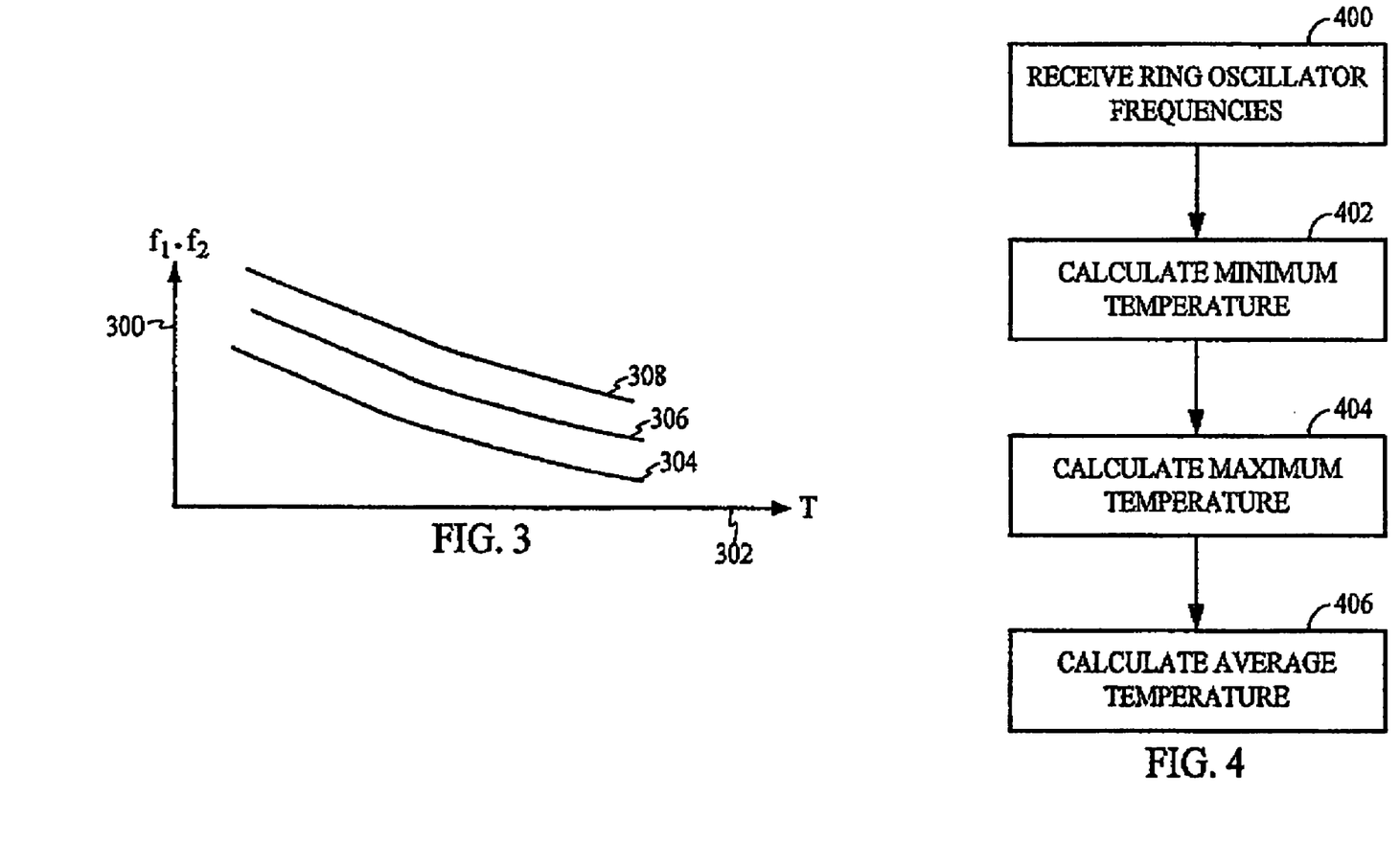
FIG. 3 illustrates an exemplary data set representing a range of characterization data of chips from a wafer, plotted as the product of ring oscillator frequencies versus temperature.
FIG. 4 is a flow chart illustrating an exemplary method for determining the operating temperature of a chip as a function of ring oscillator frequency.

FIG. 3 illustrates an exemplary data set representing a range of characterization data of chips across multiple splits. The data may be plotted, for example, to represent the product of two ring oscillator frequencies 300 versus temperature 302. On such a graph, the data will represent a range of frequency products that is representative of chips across the multiple splits, from slow chips 304, through nominal chips 306, to fast chips 308. From this approximately linear graph, a linear model can be formulated to represent the data range across the multiple splits. Thus, a set of two linear equations is established, in which the constant values $C_x$ within the equations depend on how the ring oscillators are designed for a particular split and, thus, the characterization data of chips across the multiple splits:

$$T_1 = C_1 - C_2 \cdot (f - C_3)$$

and $$T_2 = C_1 - C_2 \cdot (f - C_4)$$

where $f$ represents the product of the two ring oscillator frequencies, and $T_1$ and $T_2$ represent the minimum and maximum temperatures, respectively, that would be expected for the given $f$ within the range of splits. xyz For any particular chip, the above equations may be implemented to determine temperature T, for a given $f$, which is simply calculated as the product of two ring oscillator frequencies. FIG. 4 is a flow chart illustrating an exemplary method for determining the operating temperature of a chip as a function of ring oscillator frequency according to the above equations. The measured ring oscillator frequencies are received into the temperature calculation algorithm at block 400. Then, at blocks 402 and 404, the values for $T_1$ and $T_2$ may be calculated with the equations according to the known characterization data and the measured ring oscillator frequencies, which are represented by the constant values $C_x$. The calculated temperature values represent minimum and maximum temperatures expected for the chip given the measured ring oscillator frequency according to known characterization data of chips from the same wafer. The actual temperature of the chip may then be estimated, at block 406, as the average value $T_{avg}$ of $T_1$ and $T_2$, where the expected margin of error is $$\pm \frac{1}{2}|T_1 - T_2|.$$

Figure 5:
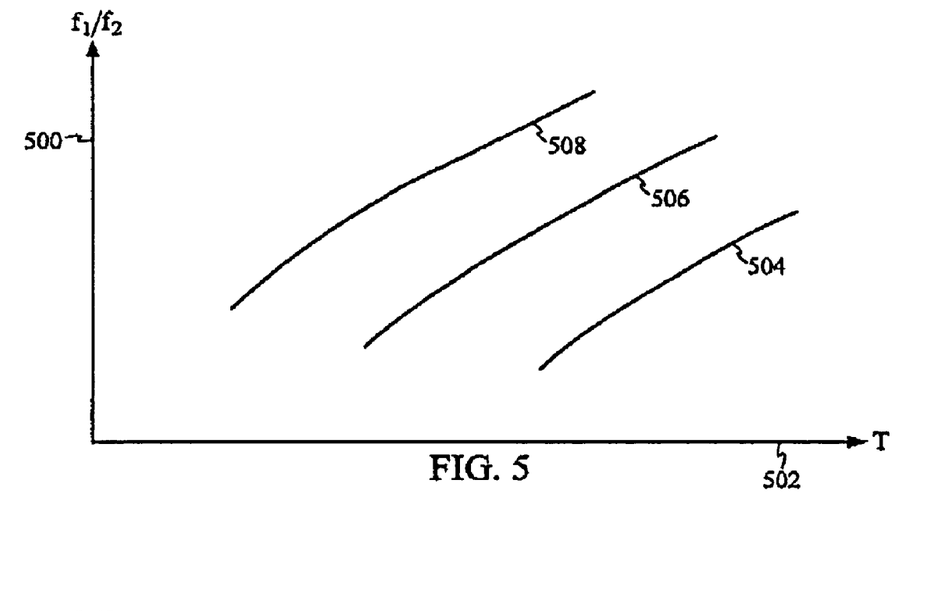
FIG. 5 illustrates an exemplary data set representing the range of characterization data of chips from a wafer, plotted as the quotient of ring oscillator frequencies versus temperature.

Once the estimated temperature value is known, the process speed of the chip can be calculated. The calculated process speed can then be compensated for based on the estimated temperature. FIG. 5 illustrates an exemplary data set representing the previously discussed range of characterization data of chips across multiple splits from a wafer, this time plotted as the quotient of the two ring oscillator frequencies 500 versus temperature 502. On such a graph, the data will represent a range of frequency quotients representative of chips across the multiple splits, from slow chips 504, through nominal chips 506, to fast chips 508. From this graph, it is apparent that, because the two ring oscillators do not have a similar slope, the ratio of their frequencies also does not result in a constant ratio over temperature. Thus, after performing division of the two ring oscillator frequency measurements, the quotient must be normalized according to the average temperature that was calculated as described above:

$$\text{Norm}\frac{f_1}{f_2} = \frac{f_1}{f_2} + (T_{max} - T_{avg})/N$$

wherein N represents a normalization factor that is determined by triangulation based on the characterization data. Those skilled in the art will recognize that the characterization data, which may be modeled with a linear equation whose slope defines a change over temperature, may be normalized so that the data is constant over temperature. Using triangulation, a normalization factor N can be calculated such that it causes the slope of the modeled data to be approximately zero, meaning that the normalized data is constant over temperature.

Figure 6:
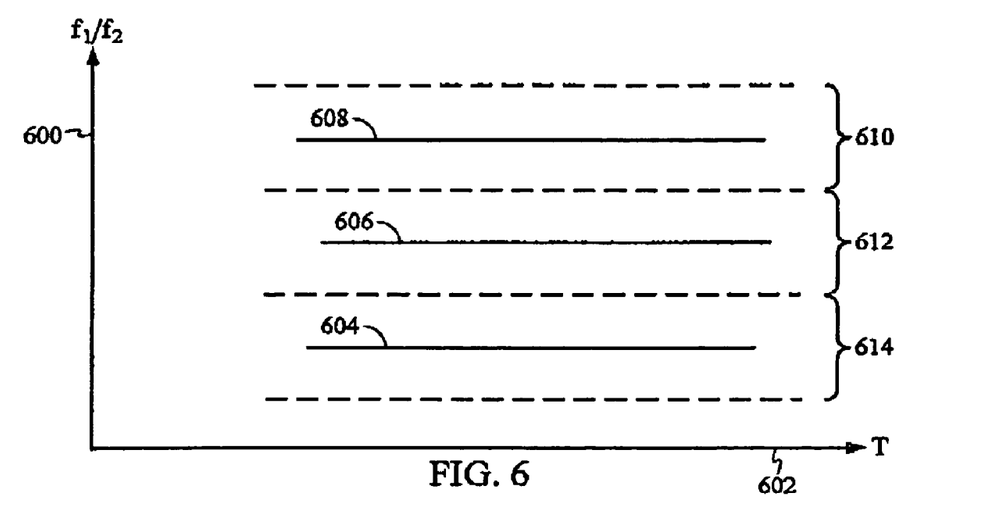
FIG. 6 illustrates an exemplary data set representing the range of characterization data of chips from a wafer, plotted as the normalized quotient of ring oscillator frequencies versus temperature.

FIG. 6 illustrates an exemplary data set representing the range of characterization data of chips across the multiple splits, this time plotted as the normalized quotient of the two ring oscillator frequencies 600 versus temperature 602. On this graph, the data will still represent the range of frequency quotients representative of chips across the splits, from slow chips 604, through nominal chips 606, to fast chips 608, but will now adhere to a linear model that is stable over temperature. Moreover, the graph identifies three known ranges of process speed for chips within this known range of splits: a fast range 610, a nominal range 612 and a slow range 614. For a chip being measured for process speed during use, depending on where the normalized quotient of its measured ring oscillator frequencies falls within the ranges indicated on the graph of FIG. 6, the chip may then be identified as fast, nominal, or slow.

Figure 7:
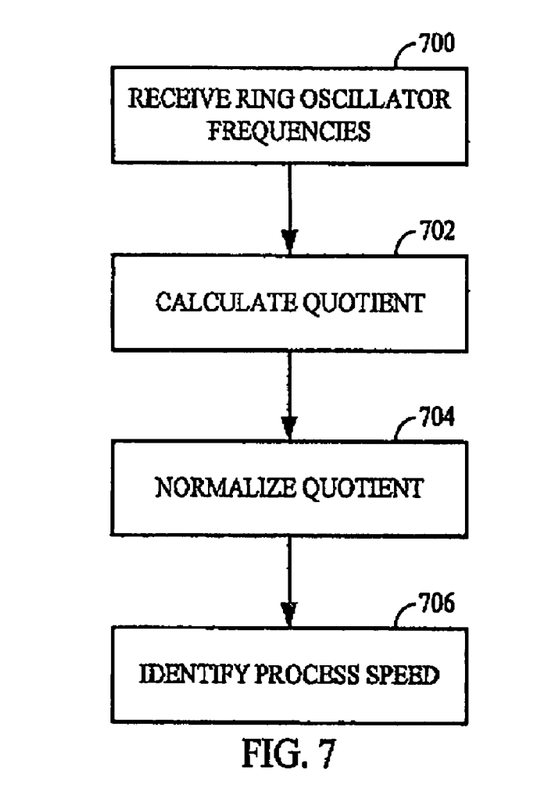
FIG. 7 is a flow chart illustrating an exemplary method for determining the process speed of a chip as a function of ring oscillator frequency and temperature.

FIG. 7 is a flow chart illustrating an exemplary method for determining the process speed of a chip as a function of ring oscillator frequency and temperature as described above. The frequencies of the two ring oscillators are received by the algorithm at block 700, and their quotient is calculated at block 702. Based on the estimated temperature value $T_{avg}$ and the characterization data, the ring oscillator frequency quotient is normalized at block 704, and its process speed may then be identified as fast, nominal or slow at block 706 using the characterization data as described above.

Figure 8:
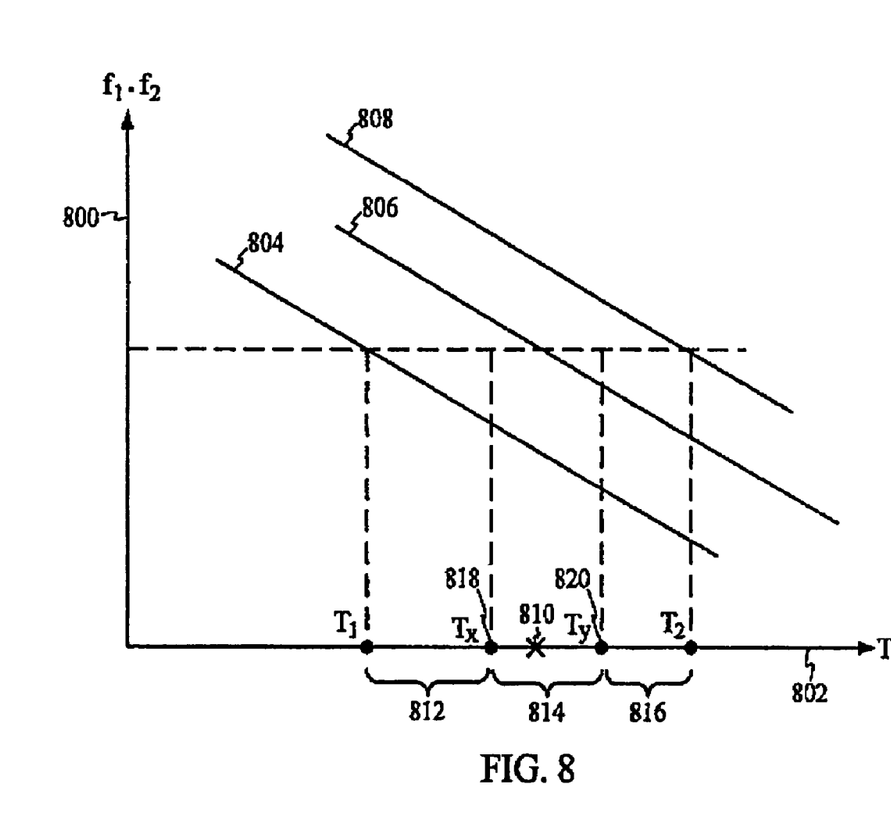
FIG. 8 illustrates the exemplary data set of FIG. 3, to which the identified chip speed is applied to adjust the previously calculated temperature.

FIG. 8 illustrates the exemplary data set of FIG. 3, to which the identified chip speed may now be applied to adjust the previously calculated temperature estimate. The characterization data, plotted as the product of ring oscillator frequencies 800 versus temperature 802 represents frequency product ranges for slow chips 804, nominal chips 806 and fast chips 808. As described above, the temperature of a chip was estimated as $T_{avg}$ 810, which was midway between the minimum temperature $T_1$ and the maximum temperature $T_2$ for the measured ring oscillator frequencies within the characterized split range. However, once the process speed has been identified as fast, nominal, or slow as described for the process speed determination method above, the initially calculated temperature estimate can be refined accordingly. Because the data in FIG. 8 is representative of chips within a slow range 812, a nominal range 814 and a fast range 816, whichever of those process ranges was identified according to the previous process speed determining method can be applied to the plot of FIG. 8 to narrow the possible temperature range. Specifically, slow range 812 is bounded by minimum temperature $T_1$ and a lower boundary temperature $T_x$ 818; nominal range 814 is bounded by lower boundary temperature $T_x$ 818 and an upper boundary temperature $T_y$ 820; and fast range 818 is bounded by upper boundary temperature $T_y$ and maximum temperature $T_2$. Thus, the refined temperature may be calculated as the midway point in whichever range was identified in the earlier process determination step, which was described above. For example, if the process speed of the chip was determined to be fast, the fast range 816 would be utilized to adjust the estimated temperature $T_{avg}$ to $$T_y + \pm \frac{1}{2}|T_2 - T_y|$$

with a reduced expected error of margin of $$\pm \frac{1}{2}|T_2 - T_y|.$$

Figure 9:
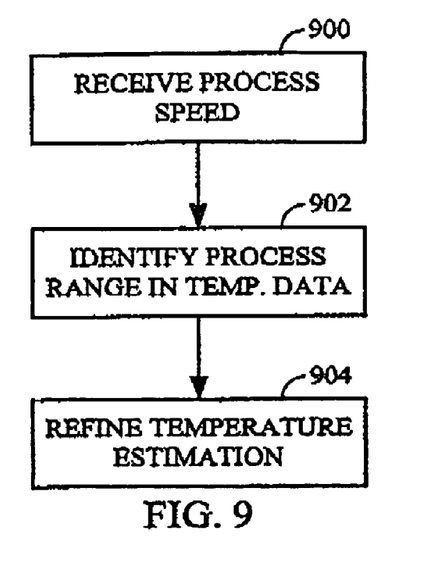
FIG. 9 is a flow chart illustrating an exemplary method for adjusting the previously calculated temperature.

FIG. 9 is a flow chart illustrating an exemplary method for adjusting the initial temperature estimation according to the method described above. At block 900 the identified process speed is received. According to the determined speed, a process range is identified within characterization temperature data, at block 902. Based on the characterization data and the identified process range, a refined temperature is estimated, with a reduced margin of error, at block 904.

Figure 10:
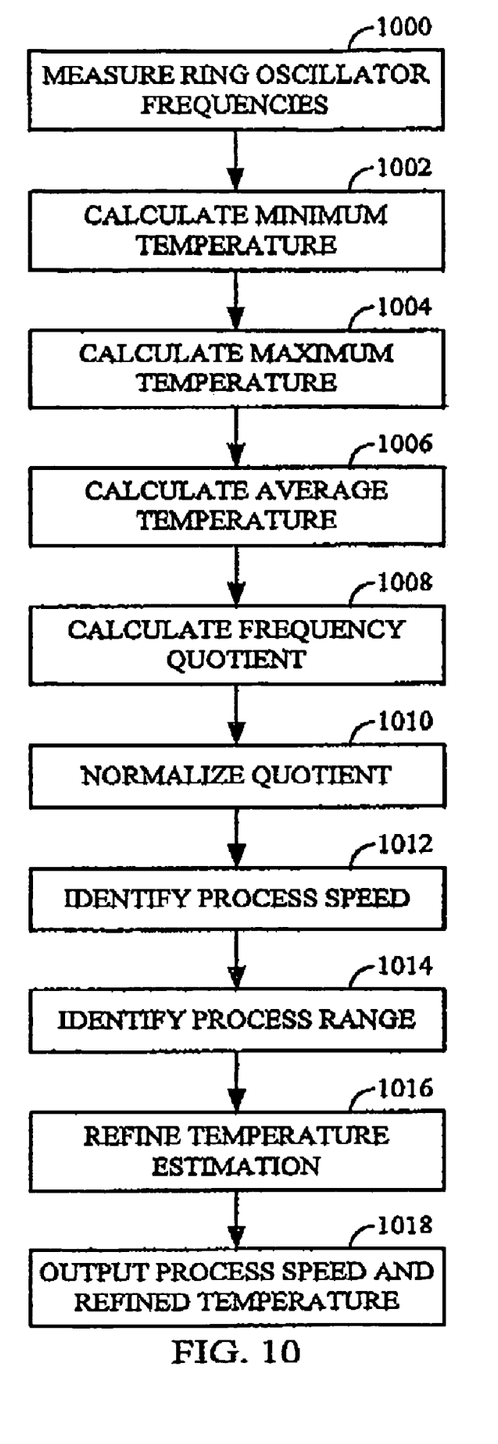
FIG. 10 is a flow chart illustrating an exemplary end to end process for calculating and identifying both temperature and process speed of a chip based on two measured ring oscillator frequencies.

FIG. 10 is a flow chart illustrating an exemplary end to end process for calculating and identifying both temperature and process speed of a chip based on two measured ring oscillator frequencies. The individual steps have been described above in terms of comprising separate algorithms. However, it will be understood by those skilled in the art that the steps may be performed individually, in combined functions, or as an end to end process or algorithm, such as that illustrated in the flow chart of FIG. 10. First, at block 1000, the frequencies of two ring oscillators of a chip from a particular split are measured as described above. Next, at block 1002, the product of the measured frequencies is calculated, and the minimum temperature for chips in that split is calculated, and at block 1004 the maximum such temperature is calculated. At block 1006, the average temperature of the previously determined minimum and maximum temperatures is calculated according to equations based on known characterization data of the split. Once it is calculated, the average temperature is stored as an initial chip temperature estimation at block 1006. Then, at block 1008, the quotient of the measured ring oscillator frequencies is calculated, and normalized according to characterization data of the split range at block 1010, as described above. Based on the normalized quotient, the process speed of the chip is identified at block 1012. Then, at block 1014, a process range is identified in the characterization data for temperatures across the multiple splits, and a refined temperature estimation is made at block 1016, accordingly. Finally, at block 1018, the end to end algorithm outputs, as a function of the initially measured ring oscillator frequencies and characterization data from the range of splits, the chip's process speed and refined temperature estimation.

Figure 11:
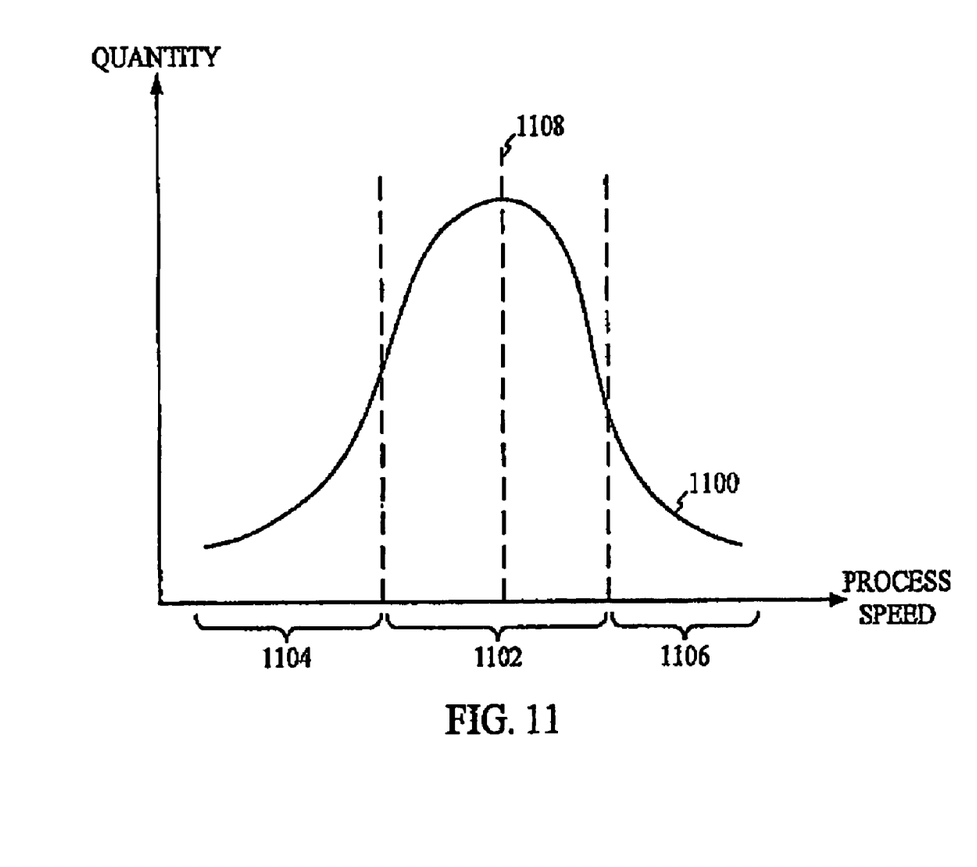
FIG. 11 is a graph illustrating an exemplary distribution of chips produced across multiple splits.

The above techniques employ a linear model based on characterization data, however it will be recognized by those skilled in the art that other mathematical models may be employed as well. For example, a second order approximation of temperature may be calculated according to the characterization data. In the event that characterization data can be represented by a second order approximation, the temperature estimation would be more accurate than temperature estimation through a series of linear equations as described above. FIG. 11 is a graph illustrating the distribution of chips produced across multiple splits obtained during an entire production cycle. From this distribution, which represents a typical Gaussian distribution of samples, a first order difference equation approach for identifying process speed and temperature of a chip can be used to enable a second order equation for yielding more accurate results than the methods previously described. The data 1100, plotted as quantity of chips vs. process speed, represent the various splits that may be produced from a wafer, and may be divided so as to fall into three categories: a nominal category 1102, slow category 1104 and fast category 1106. At the center of nominal category 1102, the device delay in terms of either of a chip's two ring oscillators, $K_{\Delta P_1}$ and $K_{\Delta P_2}$ is 0. Device delay may be calculated according to the characterization data, as will be recognized by those skilled in the art. In slow category 1104, the device delays are negative, and in the fast category 1106 the device delays are positive. For a given chip during operation, its actual device delay can be quantified and, depending on the amount of deviation from nominal center 1108, its process speed can be calculated. According to known relationships between device delay and characterization data, the ring oscillator frequencies $f_1$ and $\eta_2$ can be modeled by the following first order equations:

$$f_2 = -C_1 T + C_2 + K_{\Delta P_2}$$

and $$f_1 = -C_3 T + C_4 + K_{\Delta P_2}$$

Then, following a simple algebraic procedure for combining the two equations to remove dependency on temperature T, a scaled frequency number derived from characterization data is generated for both process ($P_{value}$) and temperature ($T_{value}$):

$$P_{value} = f_2 - C_{comb} \cdot f_1$$

and $$T_{value} = f_1 \cdot f_2$$

where the value of $C_{comb}$ is obtained through the algebraic combination of the two linear equations. With these equations for scaled frequency numbers for process and temperature, graphs of characterization data for a split are made, to represent the entire range of process and temperature scaled frequency numbers. Such graphs would plot $P_{value}$ versus temperature and $T_{value}$ versus temperature. Then, for a particular measured value of $P_{value}$ or $T_{value}$ for a given chip during use, which as shown above is based solely on the measured ring oscillator frequencies $f_1$, $f_2$ and a known constant $C_{comb}$, the process speed of the chip can be identified from the $P_{value}$ graph of split data and the temperature of the chip can be identified from the $T_{value}$ graph of split data. Of course, it is to be understood that actual graphs and plots are not necessary for implementing the methods disclosed herein. Rather, such graphs and plots of data are used for purposes of clarity in explaining the disclosed methods. Those skilled in the art will recognize that characterization data may be arranged in any format, and need only be referenced to determine particular values of a chip, but need not be referenced in a particular format. For example, characterization data may be used to determine the constants in the equations disclosed herein, which may then be implemented into particular algorithms used to calculate process speed and temperature for a particular chip based upon its operating ring oscillator frequencies.

From the equations above, a second order equation for T can be developed to calculate a more accurate temperature value. Specifically, by multiplying the two frequency equations, the flowing second order equation results:

$$f_1 \cdot f_2 = C_1 T^2 - C_2 T + C'$$

where, at $C' = C_3 + f_1 \cdot f_2, C_1 T^2 - C_2 T + C = 0$ $$\therefore T = \frac{-C_2 \pm \sqrt{C_2^2 - 4 C_1 C_3}}{2 C_1}$$

Figure 12:
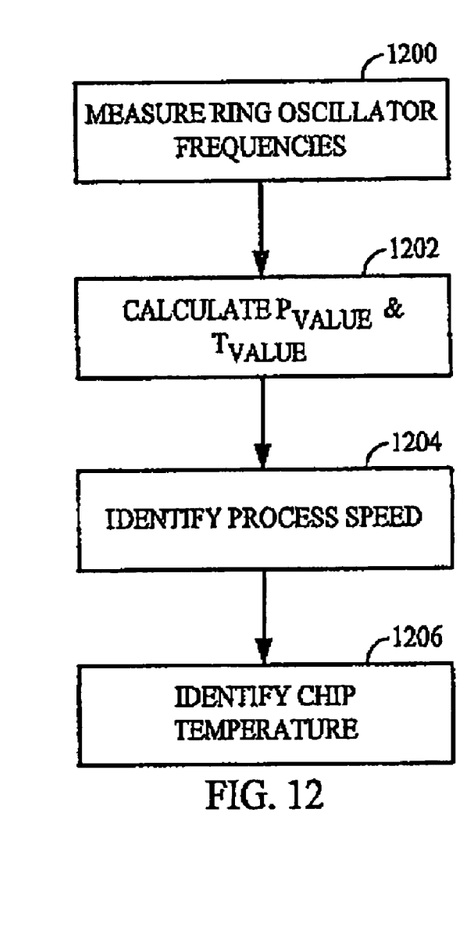
FIG. 12 is a flow chart illustrating another alternative exemplary method for determining a chip's operating temperature and speed.

FIG. 12 is a flow chart illustrating the alternative exemplary method for determining temperature and speed that was described above. At block 1200 the ring oscillator frequencies of a chip are measured. Then, at block 1202, scaled frequency numbers for process $P_{value}$ and temperature $T_{value}$ are calculated according to the formulas above. At block 1204, the calculated value of $P_{value}$ is compared to characterization data representative of the range of $P_{value}$ values in the split. From this comparison, the process speed of the chip is determined. Similarly, at block 1206, the calculated value of $T_{value}$ is compared to characterization data representative of the range of $T_{value}$ values in the split. From this comparison, the chip's temperature is determined.

The various methods described above for determining process speed and temperature of a chip using its ring oscillator frequencies can be used for a number of applications. The calculations may be achieved by algorithms implemented by software that receives input from the chip or by hardware logic added to the chip or operable in communication with the chip. In either case, the chip may have outputs from two of its ring oscillators enabled so as to provide input for any of the process speed and temperature calculating means described above, or any variation thereof.

The methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a chip. In the alternative, the processor and the storage medium may reside as discrete components in a chip.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for determining an operating parameter of a chip having first and second ring oscillators, comprising:
    measuring a frequency of the first ring oscillator;
    measuring a frequency of the second ring oscillator;
    multiplying, by a processor, the measured frequency of the first ring oscillator by the measured frequency of the second ring oscillator to obtain a result; and
    determining, by the processor, as a function of the result and characterization data of the chip, the chip's actual temperature.

2. The method of claim 1 wherein the measuring of the first ring oscillator frequency comprises:

obtaining two ring oscillator clock counts, separated by a time difference, from a ring oscillator;

obtaining two independent clock counts, separated by the time differences, from a clock output independent from the ring oscillator; and calculating a ratio of the difference between the two ring oscillator clock values and the difference between the two independent clock values.

3. The method of claim 1, further comprising:

calculating a scaled frequency value from the first and second measured ring oscillator frequencies and characterization data of the chip;

comparing the calculated scaled frequency value with a known range of scaled frequency values relative to temperature; and determining, from the comparison, the actual temperature of the chip.

4. A computer-readable storage medium embodying a program of instructions executable by a computer to determine an operating parameter of a chip having first and second ring oscillators, the executable instructions for:

measuring a frequency of the first ring oscillator;

measuring a frequency of the second ring oscillator;

multiplying the measured frequency of the first ring oscillator by the measured frequency of the second ring oscillator to obtain a result; and determining, as a function of the result and characterization data of the chip, the chip's temperature.

5. The computer-readable storage medium of claim 4 wherein the instructions for measuring the first ring oscillator frequency comprise instructions for:

obtaining two ring oscillator clock counts, separated by a time difference, from a ring oscillator;

obtaining two independent clock counts, separated by the time difference, from a clock output independent of the ring oscillator; and calculating a ratio of the difference between the two ring oscillator clock values and the difference between the two independent clock values.

6. The computer-readable storage medium of claim 4, further comprising executable instructions for:

calculating a scaled frequency value from the first and second measured ring oscillator frequencies and characterization data of the chip;

comparing the calculated scaled frequency value with a known range of scaled frequency values relative to temperature; and determining, from the comparison, the actual temperature of the chip.

7. A system comprising:

a chip having first and second ring oscillators; and a processor configured to:

measure a frequency of the first ring oscillator;

measure a frequency of the second ring oscillator;

multiply the measured frequency of the first ring oscillator by the measured frequency of the second ring oscillator to obtain a result; and determine, as a function of the result and characterization data of the chip, the chip's actual temperature.

8. The system of claim 7 wherein the chip comprises the processor.

9. The system of claim 7 wherein the processor is separate from but operably connected to the chip.

10. The system of claim 7 wherein the chip additionally comprises:

a first counter configured to obtain two ring oscillator clock counts, separated by a time difference, from the first ring oscillator;

a second counter configured to obtain two independent clock counts, separated by the time difference, from a clock output independent of the first and second ring oscillators; and wherein the processor is further configured to calculate a ratio of the difference between the two ring oscillator clock values and the difference between the two independent clock values.

11. The system of claim 7, wherein the processor is further configured to:

calculate a scaled frequency value from the first and second measured ring oscillator frequencies and characterization data of the chip;

compare the calculated scaled frequency value with a known range of scaled frequency values relative to temperature; and determine, from the comparison, the actual temperature of the chip.

12. A processor comprising:

means for measuring a frequency of a first ring oscillator;

means for measuring a frequency of the second ring oscillator;

means for multiplying the measured frequency of the first ring oscillator by the measured frequency of the second ring oscillator to obtain a result; and means for determining, as a function of the result and characterization data of the chip, the chip's temperature.

13. The processor of claim 12 further comprising means for determining a process speed of the chip in response to the actual temperature.

14. A method for determining a process speed of the chip in response to the actual temperature, having first and second ring oscillators, comprising:

measuring a frequency of the first ring oscillator;

measuring a frequency of the second ring oscillator;

dividing, by a processor, the measured frequency of the first ring oscillator frequency by the measured frequency of the second ring oscillator to obtain a result; and determining, by the processor, as a function of the division result and characterization data of the chip, the chip's process speed.

15. The method of claim 14, further comprising:

multiplying the measured frequency of the first ring oscillator by the measured frequency of the second ring oscillator to obtain a second result;

determining, as a function of the second result and the characterization data, the chip's actual temperature; and adjusting the determined process speed according to the determined actual temperature.

16. The method of claim 14, further comprising:

calculating a scaled frequency value from the first and second measured ring oscillator frequencies and characterization data of the chip;

comparing the calculated scaled frequency value with a known range of scaled frequency numbers relative to process speed; and determining, from the comparison, the process speed of the chip.

17. A computer-readable storage medium embodying a program of instructions executable by a computer to determine a process speed of the chip in response to the actual temperature, having first and second ring oscillators, the executable instructions for:

measuring a frequency of the first ring oscillator;
measuring a frequency of the second ring oscillator;
dividing the measured frequency of the first ring oscillator frequency by the measured frequency of the second ring oscillator to obtain a result; and
determining, as a function of the result and characterization data of the chip, the chip's process speed.

18. The computer-readable storage medium of claim 17, further comprising executable instructions for:
   multiplying the measured frequency of the first ring oscillator by the measured frequency of the second ring oscillator to obtain a second result;
   determining, as a function of the second result and the characterization data, the chip's actual temperature; and
   adjusting the determined process speed according to the determined actual temperature.

19. The computer-readable storage medium of claim 17, further comprising executable instructions for:
   calculating a scaled frequency value from the first and second measured ring oscillator frequencies and characterization data of the chip;
   comparing the calculated scaled frequency value with a known range of scaled frequency numbers relative to process speed; and
   determining, from the comparison, the process speed of the chip.

20. A system configured to determine a process speed of the chip in response to the actual temperature, comprising:
   a chip having first and second ring oscillators; and
   a processor configured to:
      measure a frequency of the first ring oscillator;
      measure a frequency of the second ring oscillator;
      divide the measured frequency of the first ring oscillator frequency by the measured frequency of the second ring oscillator to obtain a result; and
      determine, as a function of the result and characterization data of the chip, the chip's process speed.

21. The system of claim 20, wherein the processor is further configured to:
   multiply the measured frequency of the first ring oscillator by the measured frequency of the second ring oscillator to obtain a second result;
   determine, as a function of the second result and the characterization data, the chip's actual temperature; and
   adjust the determined process speed according to the determined actual temperature.

22. The system of claim 20, wherein the processor is further configured to:
   calculate a scaled frequency value from the first and second measured ring oscillator frequencies and characterization data of the chip;
   compare the calculated scaled frequency value with a known rang of scaled frequency numbers relative to process speed; and
   determine, from the comparison, the process speed of the chip.

* * * * *